United States Patent
Coronel et al.

(10) Patent No.: US 7,691,727 B2
(45) Date of Patent: Apr. 6, 2010

(54) METHOD FOR MANUFACTURING AN INTEGRATED CIRCUIT WITH FULLY DEPLETED AND PARTIALLY DEPLETED TRANSISTORS

(75) Inventors: Philippe Coronel, Saint Paul de Varces (FR); Michel Marty, Barraux (FR)

(73) Assignees: STMicroelectronics S.A., Montrouge (FR); STMicroelectronics Crolles 2 SAS, Crolles (FR)

( * ) Notice: Subject to any disclaimer, the term of this patent is extended or adjusted under 35 U.S.C. 154(b) by 341 days.

(21) Appl. No.: 11/846,622

(22) Filed: Aug. 29, 2007

(65) Prior Publication Data
US 2008/0064174 A1 Mar. 13, 2008

(30) Foreign Application Priority Data
Aug. 31, 2006 (FR) .................................... 06 53524

(51) Int. Cl.
*H01L 21/00* (2006.01)
(52) U.S. Cl. ..................... 438/464; 438/33; 438/68; 438/153; 438/154; 438/199
(58) Field of Classification Search ............... 438/33, 438/68, 153, 154, 199, 275, 464
See application file for complete search history.

(56) References Cited

U.S. PATENT DOCUMENTS

| | | | | |
|---|---|---|---|---|
| 4,224,734 | A * | 9/1980 | Tiefert et al. | 438/460 |
| 5,479,033 | A * | 12/1995 | Baca et al. | 257/192 |
| 6,111,280 | A * | 8/2000 | Gardner et al. | 257/253 |
| 6,222,234 | B1 * | 4/2001 | Imai | 257/347 |
| 6,664,146 | B1 | 12/2003 | Yu | |
| 6,927,102 | B2 * | 8/2005 | Udrea et al. | 438/140 |
| 7,157,054 | B2 * | 1/2007 | Toyoda et al. | 422/88 |
| 2002/0146892 | A1 * | 10/2002 | Notsu et al. | 438/455 |
| 2005/0023656 | A1 | 2/2005 | Leedy | |
| 2005/0269595 | A1 | 12/2005 | Tezuka | |
| 2006/0091427 | A1 | 5/2006 | Waite et al. | |
| 2007/0164318 | A1 * | 7/2007 | Takizawa | 257/211 |

OTHER PUBLICATIONS

Tezuka, T. et al. "Selectively-formed high mobility SiGe-on-Insulator pMOSFETs with GE-rich strained surface channels using local condensation technique" IEEE proceedings, 2004 Symposium on VLSI technology digest of technical papers, pp. 198-199.*

(Continued)

*Primary Examiner*—Ha Tran T Nguyen
*Assistant Examiner*—Karen M Kusumakar
(74) *Attorney, Agent, or Firm*—Lisa K. Jorgenson; James H. Morris; Wolf, Greenfield & Sacks, P.C.

(57) ABSTRACT

A method for manufacturing an integrated circuit containing fully and partially depleted MOS transistors, including the steps of forming similar MOS transistors on a thin silicon layer formed on a silicon-germanium layer resting on a silicon substrate; attaching the upper surface of the structure to a support wafer; eliminating the substrate; depositing a mask and opening this mask at the locations of the fully-depleted transistors; oxidizing the silicon-germanium at the locations of the fully-depleted transistors in conditions such that a condensation phenomenon occurs; and eliminating the oxidized portion and the silicon-germanium portion, whereby there remain transistors with a thinned silicon layer.

15 Claims, 2 Drawing Sheets

OTHER PUBLICATIONS

Tezuka, T. et al. A new strained-SOI-GOI dual CMOS technology based on local condensation technique: IEEE proceedings, 2005 Symposium on VLSI technology digest of technical papers, pp. 80-81.*

Tezuka T. et al. "Selectively-formed high mobility SiGe-on-insulator pMOSFETs with Ge-rich strained surface channels using local condensation technique" VLSI Technology, 2004, Digest of Technical Papers, 2004 Symposium on Honolulu, HI, USA Jun. 15-17, 2004, Piscataway, NJ, USA, IEEE, Jun. 15, 2004, pp. 198-199, XP010732864 ISBN: 0-7803-8289-7.

French Search Report from French Patent Application 06/53524, filed Aug. 31, 2006.

Rauly E. et al. "On the subthreshold swing and short channel effects in single and double gate deep submicron SOI-MOSFETs" Solid State Electronics, Elsevier Science Publishers, Barking, GB, vol. 43, No. 11, Nov. 1999, pp. 2033-2037, XP004333799 ISSN: 0038-1101.

Tezuka T. et al. "Selectively-formed high mobility SiGe-on-insulator pMOSFETs with Ge-rich strained surface channels using local condensation technique" VLSI Technology, 2004, Digest of Technical Papers, 2004 Symposium on Honolulu, HI, USA Jun. 15-17, 2004, Piscataway, NJ, USA, IEEE, Jun. 15, 2004, pp. 198-199, XP010732864 ISBN: 0/7803-8289-7.

Taraschi G. et al. "Strained Si, SiGe, and Ge on-insulator: review of wafer bonding fabrication techniques" Solid State Electronics, Elsevier Science Publishers, Barking, GB, vol. 48, No. 8, Aug. 2004, pp. 1297-1305, XP004505230 ISSN: 0038-1101.

Coronel et al. "3D Integration of Ultimate Devices Thanks to SiGe" Electrochemical Society Proceedings, vol. 2004, no. 07, 2004, pp. 701-717, XP009080993.

* cited by examiner

METHOD FOR MANUFACTURING AN INTEGRATED CIRCUIT WITH FULLY DEPLETED AND PARTIALLY DEPLETED TRANSISTORS

BACKGROUND OF THE INVENTION

1. Field of the Invention

The present invention relates to the field of integrated circuits and, more specifically, of integrated circuits of very small dimensions, on the order of some ten nanometers.

2. Discussion of the Related Art

In the field of integrated circuits containing transistors having dimensions on the order of some ten nanometers, MOS transistors formed on a thin silicon layer are here considered. It has been acknowledged that the behavior of such transistors is different according to whether, when the transistor is on, the channel region takes up the entire thickness of a very thin silicon layer or takes up but a portion of the thickness of a slightly thicker silicon layer. In the first case, it is spoken of fully depleted transistors and, in the second case, of partially depleted transistors. For example, for a MOS transistor having a gate length on the order of 10 nm, a fully depleted transistor will be formed in a silicon layer of a thickness from 10 to 20 nm and the source and drain regions will take up this entire thickness. However, a partially depleted transistor will be, for example, formed in a silicon layer having a thickness of approximately 70 nm, the source and drain regions penetrating down to a depth ranging from approximately 10 to 20 nanometers.

It may be desired to form, in a same integrated circuit, fully depleted transistors which will have the advantage of a great switching speed and partially depleted transistors which will have the advantage of being able to stand slightly higher voltages than fully depleted transistors.

SUMMARY OF THE INVENTION

An aspect of the present invention provides an integrated circuit containing these two types of transistors and a manufacturing method enabling obtaining with accuracy the two transistor types.

An embodiment of the present invention provides a method for manufacturing an integrated circuit containing fully depleted MOS transistors and partially depleted MOS transistors, comprising the steps of:

a) forming similar MOS transistors on a thin silicon layer formed on a silicon-germanium layer resting on a silicon substrate;

b) attaching the upper surface of the formed structure to a support wafer;

c) eliminating said substrate until the silicon-germanium layer is apparent;

d) depositing a mask and opening this mask at the locations of transistors which are desired to be fully depleted;

e) oxidizing the silicon-germanium at the locations of transistors which are desired to be fully depleted in conditions such that a condensation phenomenon occurs and that the front between the silicon and the silicon-germanium moves in the silicon layer; and f) eliminating the oxidized portion and the silicon-germanium portion, whereby there remain transistors with a thinned silicon layer.

According to an embodiment of the present invention, step a) comprises the step of coating the structure with layers, the last one of which is a polished planar layer.

According to an embodiment of the present invention, said polished planar layer is a silicon oxide layer.

According to an embodiment of the present invention, step b) comprises the step of applying the structure on a silicon wafer by molecular bonding.

According to an embodiment of the present invention, said thin silicon layer has an initial thickness on the order of from 50 to 70 nm and a thickness after thinning on the order of from 10 to 20 nm.

According to an embodiment of the present invention, the method further comprises steps of contacting from the side from which the substrate has been eliminated.

According to an embodiment of the present invention, the method further comprises steps of placing of a new wafer on the side from which the substrate has been eliminated.

The foregoing and other objects, features, and advantages of the present invention will be discussed in detail in the following non-limiting description of specific embodiments in connection with the accompanying drawings.

DETAILED DESCRIPTION

Figure 1:
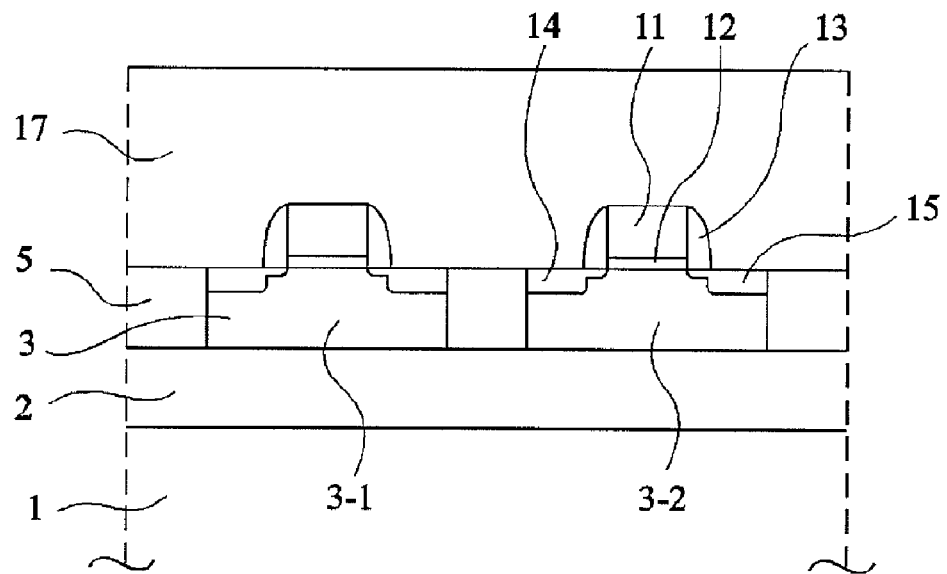
FIGS. 1 to 4 are simplified cross-section views illustrating successive steps of manufacturing of a fully depleted transistor and of a partially depleted transistor in a same integrated circuit according to an embodiment of the present invention.

For clarity, the same elements have been designated with the same reference numerals in the different drawings and, further, as usual in the representation of integrated circuits, the various drawings are not drawn to scale.

FIGS. 1 to 4 are simplified cross-section views of a portion of a semiconductor device illustrating successive steps of the manufacturing of a fully-depleted transistor and of a partially depleted transistor in the same integrated circuit according to an embodiment of the present invention.

First, as illustrated in FIG. 1, a thin single-crystal silicon-germanium layer 2 is grown on a semiconductor substrate 1, for example, silicon. On layer 2, a thin single-crystal silicon layer 3 is grown, which is divided into wells or active areas in which elementary components are formed. The separation into wells is ensured by insulating regions 5, currently designated in the art as STIs (for shallow trench insulation), extending across the entire thickness of silicon layer 3. Wells containing transistors will here be considered. Two MOS transistors comprising a gate 11 formed on an insulator 12 and surrounded with spacers 13 so that a channel is capable of forming between source and drain regions 14 and 15 in well 3 have been very schematically shown in the drawing. Each of the transistors, as shown, is a partially depleted transistor, that is, the depth of the source and drain regions is much smaller than the thickness of the well in which the transistor is formed. To give an example of an order of magnitude, silicon-germanium layer 2 may have a thickness on the order of from 50 to 100 nm, thin silicon layer 3 may also have a thickness on the order of from 50 to 100 nm, and the source and drain regions are capable of penetrating into the well down to a depth from 10 to 30 nm.

It should be understood by those skilled in the art that the representation of the transistors is very simplified. In particular, more complex structures of spacers as well as contact recovery silicide regions and metallizations are usually provided, although not shown. The contacts and the metallizations may be formed at this stage or subsequently, after the full manufacturing of the fully and partially depleted devices.

The structure is coated with an assembly of layers designated with reference numeral 17 alternately containing insulating layers and portions of conductive layers to ensure interconnects between components. The upper portion of this assembly of layers 17 is, in the shown example, a silicon oxide layer 5 planarized to be planar and polished.

Figure 2:
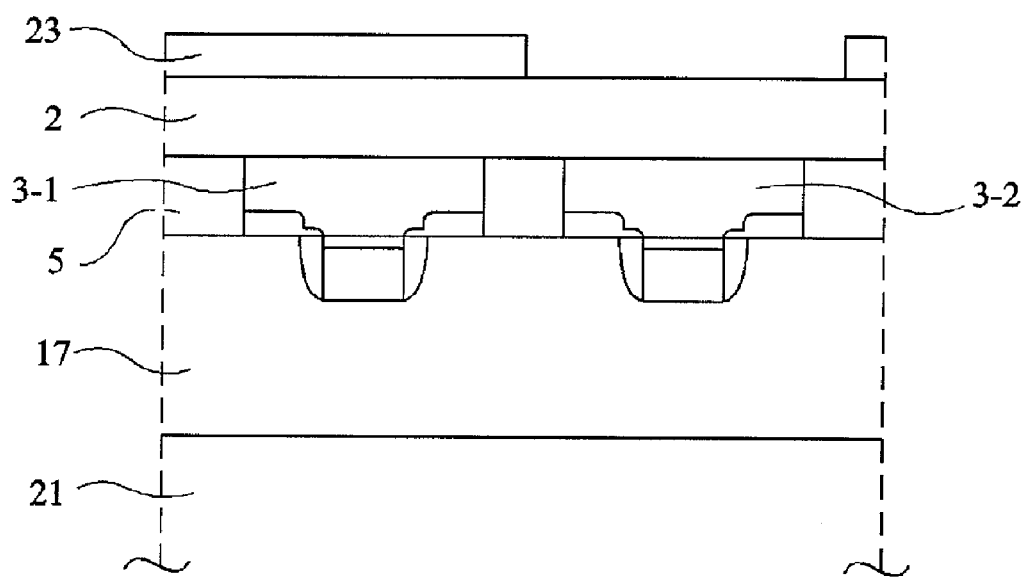

At the step illustrated in FIG. 2, the upper surface of layer 17 is stuck on a new substrate 21, preferably, a silicon wafer. The sticking may be performed by molecular bonding or by any adequate method.

Then, initial substrate 1, which should be at the top in the representation of FIG. 2, is eliminated, for example, in a lapping step followed by an etching which is extremely selective between the silicon of substrate 1 and the silicon-germanium of layer 2. Then, silicon-germanium layer 2 is coated with a mask, for example, a silicon nitride mask 23 which is open at the locations where fully depleted MOS transistors are desired to be formed.

Figure 3:
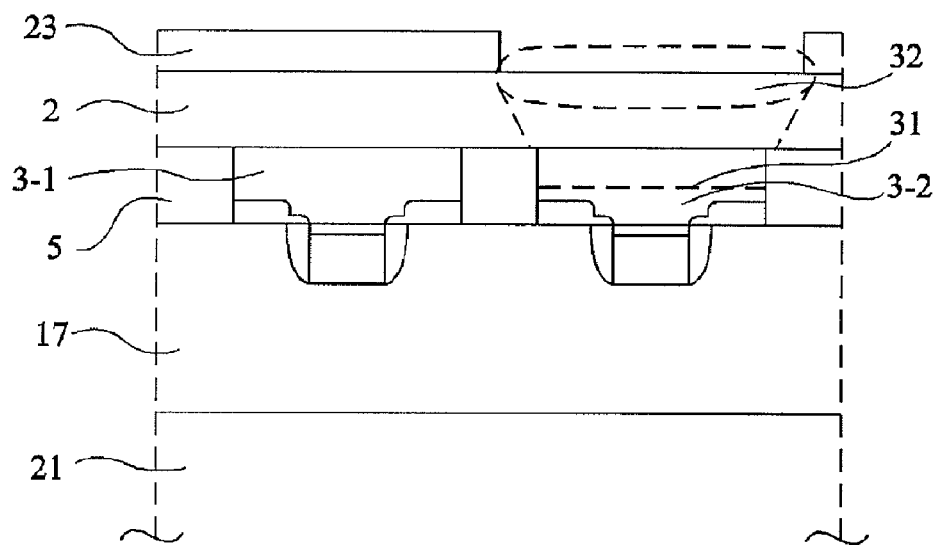

At the step illustrated in FIG. 3, the apparent silicon-germanium in the opening formed in silicon nitride layer 23 is oxidized. A known condensation phenomenon then occurs, according to which the germanium of the silicon-germanium layer migrates into silicon well 3-2. Thus, after a given time, the front between the silicon and the silicon-germanium has moved down (in the representation of FIG. 3) to reach the immediate neighborhood of the drain/source junctions. This front line is designated in FIG. 3 with reference numeral 31. However, the external portion of the initial silicon-germanium layer, on the side of the opening in silicon nitride layer 23, oxidizes. The oxidized region is designated with reference numeral 32.

An advantage of this condensation phenomenon is that it is very well controlled and that, if an oxidation is performed for a determined time, the depth by which the front between the silicon-germanium and the silicon moves can be accurately determined, as described in T. Tezuka et al., IEEE Proceedings of 2004 Symposium on VLSI Technology, pp. 198-199 and in T. Tezuka et al., IEEE Proceedings of 2005 Symposium on VLSI Technology, pp. 80-81.

Figure 4:
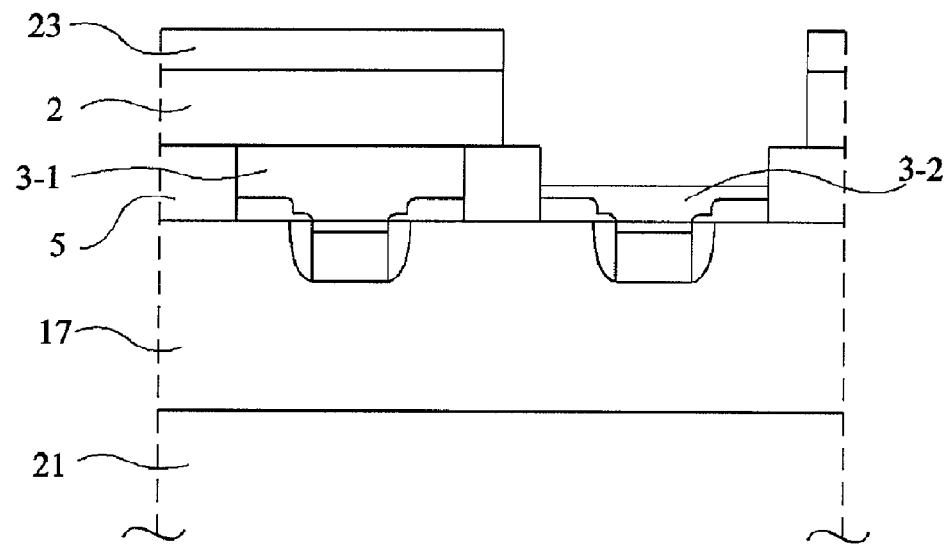

FIG. 4 shows a next step of the method according to an embodiment of the present invention in which, after having carried out the previously-described oxidation-condensation steps, the silicon oxide formed in the opening in layer 23 is selectively etched. Indeed, a silicon nitride layer 23 had been selected to be able to selectively etch the silicon oxide with respect to this layer. Of course, those skilled in the art may select other appropriate materials, the important thing being to obtain this etch selectivity with respect to silicon oxide 32 formed at the step illustrated in FIG. 3. In a second step, the silicon-germanium is selectively etched with respect to silicon to keep a silicon well 3-2 of decreased thickness with respect to its initial thickness. For example, the oxidation-condensation step will have been carried on until the front between the silicon-germanium and the silicon is at a distance on the order of from 10 to 20 nm from the surface (smaller in the drawing) of the gate insulator.

First partially depleted transistors in wells 3-1 of a much greater thickness than the depth of the source-drain regions and second fully depleted transistors for which the thickness of the silicon layer is on the order of from 10 to 15 nanometers will thus have been obtained, as desired.

Various ways to complete the device may be envisaged.

A first way to complete the device comprises, after having possibly removed nitride and SiGe layers 23 and 2, respectively, depositing a protection layer, for example, an oxide layer. Vias are then pierced through the structure from the upper surface in FIG. 4, at locations where it will have been avoided to form active devices, to form contact recoveries with metallizations provided in layer assembly 17. Some direct contacts having their surfaces usually designated as rear surfaces which are now apparent may besides be taken from the upper surface. Dielectrics may also be deposited, before depositing the protection layer, on the rear surfaces of the transistors to place the transistor wells under compression or tension which, in a known fashion, modifies the mobility of the carriers in these wells and thus the features of the transistors. Advantage may also be taken of the fact that access is had to the usually rear surface of the well of a transistor to deposit, with an interposed insulating layer, a conductive layer that can be used as a "rear gate" enabling giving the transistors additional control capacities, the front and rear gates of a transistor being simultaneously or independently controlled.

A second way to complete the device comprises filling the openings illustrated in FIG. 4 above the fully depleted transistors, eliminating layer 23, eliminating or not SiGe layer 2, and depositing a silicon oxide layer (or oxidizing the apparent surface of the SiGe layer) to attach the oxidized surface of the structure to a new substrate which would take up the position of previously-eliminated substrate 1. In this case, substrate 21 will then be eliminated and an integrated circuit structure having the usual aspect (the gates being on the top side, on the apparent surface side), but on which fully depleted transistors and partially depleted transistors will have been formed, will have been obtained.

It should be understood by those skilled in the art that the present invention is likely to have many variations, as concerns the indicated dimensions as well as the nature of the various materials. Such materials must indeed be selected according to their features of being semiconductors, insulators, or conductors, and according to their mutually selective etch features.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an integrated circuit containing fully depleted MOS transistors and partially depleted MOS transistors, comprising the steps of:
   a) forming similar MOS transistors on a thin silicon layer formed on a silicon-germanium layer resting on a silicon substrate to form a structure;
   b) attaching an upper surface of the formed structure to a support wafer;
   c) eliminating said substrate until the silicon-germanium layer is apparent;
   d) depositing a mask and opening this mask at the locations of transistors which are desired to be fully depleted;
   e) oxidizing the silicon-germanium at the locations of transistors which are desired to be fully depleted in conditions such that a condensation phenomenon occurs and that the front between the silicon and the silicon-germanium moves in the silicon layer; and
   f) eliminating the oxidized portion and the silicon-germanium portion, whereby there remain transistors with a thinned silicon layer.

2. The method of claim 1, wherein step a) comprises the step of coating the structure with an assembly of layers, the last one of which is a polished planar layer.

3. The method of claim 2, wherein said polished planar layer is a silicon oxide layer.

4. The method of claim 1, wherein step b) comprises the step of applying the structure on a silicon wafer by molecular bonding.

5. The method of claim 1, wherein said thin silicon layer has an initial thickness on the order of from 50 to 70 nm and a thickness after thinning on the order of from 10 to 20 nm.

6. The method of claim 1, further comprising the step of forming contacts on the side from which the substrate has been eliminated to electrically couple to the transistors.

7. The method of claim 1, further comprising the step of placing a new wafer on the side from which the substrate has been eliminated.

8. A method for manufacturing an integrated circuit containing fully depleted MOS transistors and partially depleted MOS transistors, comprising the steps of:
   a) forming similar MOS transistors on a silicon layer formed on a silicon-germanium layer to form a structure;
   b) oxidizing the silicon-germanium at the locations of transistors which are desired to be fully depleted in conditions such that a condensation phenomenon occurs and that the front between the silicon layer and the silicon-germanium layer moves in the silicon layer; and
   c) eliminating a resulting oxidized portion and a silicon-germanium portion from the locations of transistors which are desired to be fully depleted, whereby transistors, each with a thinned silicon layer, is formed.

9. The method of claim 8, further comprising coating the structure with an assembly of layers and polishing the last layer to produce a polished planar layer.

10. The method of claim 9, wherein coating the structure with an assembly of layers comprises providing a silicon oxide layer as the last layer.

11. The method of claim 9, further comprising molecular bonding the assembly of layers to a silicon wafer.

12. The method of claim 8, wherein oxidizing the silicon-germanium layer comprises oxidizing until a resulting thickness of the silicon layer is between approximately 10nm and 20nm.

13. The method of claim 8, further comprising forming contacts to electrically couple with the transistors.

14. The method of claim 9, further comprising placing a wafer over the assembly of layers.

15. The method of claim 9, wherein coating the structure with an assembly of layers comprises coating the structure with an assembly of layers alternately containing insulating layers and portions of conductive layers.

* * * * *

UNITED STATES PATENT AND TRADEMARK OFFICE
CERTIFICATE OF CORRECTION

PATENT NO. : 7,691,727 B2
APPLICATION NO. : 11/846622
DATED : April 6, 2010
INVENTOR(S) : Philippe Coronel et al.

It is certified that error appears in the above-identified patent and that said Letters Patent is hereby corrected as shown below:

Claim 5, col. 5, line 6 should read:
a thickness after thinning on the order of from 10 to 20 nm.

Signed and Sealed this

Twenty-fifth Day of May, 2010

David J. Kappos
*Director of the United States Patent and Trademark Office*